United States Patent [19]
Mercer

[11] Patent Number: 6,031,477
[45] Date of Patent: Feb. 29, 2000

[54] DIFFERENTIAL CURRENT SWITCH

[75] Inventor: Douglas A. Mercer, Bradford, Mass.

[73] Assignee: Analog Devices, Inc., Norwood, Mass.

[21] Appl. No.: 09/074,183

[22] Filed: May 7, 1998

[51] Int. Cl.[7] ..................................................... H03M 1/66
[52] U.S. Cl. ............................................................. 341/144
[58] Field of Search ................................... 341/144, 153, 341/136, 119, 145

[56] References Cited

U.S. PATENT DOCUMENTS

| | | |
|---|---|---|
| 4,721,866 | 1/1988 | Chi et al. . |
| 5,148,164 | 9/1992 | Nakamura et al. . |
| 5,450,084 | 9/1995 | Mercer . |
| 5,612,697 | 3/1997 | Mercer . |
| 5,689,257 | 11/1997 | Mercer et al. . |
| 5,703,519 | 12/1997 | Crook et al. . |
| 5,790,060 | 8/1998 | Tesch ........................................ 341/119 |
| 5,917,360 | 7/1999 | Yasutake ................................... 341/136 |

*Primary Examiner*—Brian Young
*Attorney, Agent, or Firm*—Samuels, Gauthier & Stevens, LLP

[57] ABSTRACT

A differential current switch including a differential switch pair of transistors having first and second complementary control inputs which receive first and second complementary signals so as to be controlled by a control signal with equal delay from a clock signal. A first set of switching transistors is coupled to provide the first complementary signal which controls the first complementary control input of the differential switch pair. A second set of switching transistors is coupled to provide the second complementary signal which controls the second complementary control input of the differential switch pair. First delay transistor pairs are coupled to the complementary outputs of the cross coupled inverter and have the characteristic that the fall times of its outputs are greater than the rise time of its outputs. Second delay transistor pairs are coupled to the first delay transistor pairs and have the characteristic that the rise times of its outputs are greater than the fall times of its outputs. The second delay transistor pairs are coupled to the first and second sets of switching transistors such that a first output of the second delay transistor pairs provides a first input signal to the first set of switching transistor pairs and a second input signal of the second set of switching transistor pairs, and a second output of the second delay transistor pairs provides the second input signal to the first set of switching transistor pairs and the first input signal of the second set of switching transistor pairs.

22 Claims, 8 Drawing Sheets

DIFFERENTIAL CURRENT SWITCH

BACKGROUND OF THE INVENTION

1. Field of the Invention

The invention generally relates to differential switch circuits of the type utilized in digital-to-analog converters (DACs). In particular, the invention relates to the circuitry of a switched current CMOS DAC which latches, drives, and switches the current to one or the other of differential outputs.

2. Description of the Prior Art

DACs generally have comprised a number of switches which are selectively operated by a multi-bit digital input signal to produce corresponding binarily-weighted bit currents to be summed as an analog output signal. Such converters ordinarily are formed as integrated circuits, with each switch comprising two transistors arranged as a differential switch-pair. The individual transistors of such a switch-pair typically are controlled by complementary signal sources which operate to turn one switch on while turning the other switch off. One of the two switches is coupled to a summing bus, and the other switch is coupled to a common line such as ground.

One problem with such prior art switching arrangements is that there is asymmetry in the switch turn-on and turn-off speeds. The switches are generally switched simultaneously to provide valid current levels at the output terminal. However, there is often a delay introduced between the "make" and "break" actions of the switches causing spurious signals, or "glitches", to appear at the output terminal.

Examples of prior art DAC switching techniques are found in U.S. Pat. Nos. 5,703,519, 5,689,257, 5,612,697, 5,450,084, 5,148,164, and 4,721,866. The techniques build on the concept that there should be only one polarity of device used in the clocked pass gates, and dynamic storage of the previous state right at the differential switch is the best way to insure exact timing from the clock. It is important to move the point at which the final differential switch signal is created as close to the current switch as possible.

Unfortunately, the prior art does not include a method of creating the true and complement logic signals which the invention does. The method by which these two logic signals are created and propagated is integral to the invention.

The prior art does not teach the need for exact timing delays from the clock signal to the drivers when used in signal reconstruction from sampled data applications. The prior art does not describe the use of temporary dynamic storage as a means to realign the arrival of the true and complementary signal. The invention involves a method and apparatus to create the optimal true and complement driving waveforms which exploits the property of dynamic storage at the gates of the differential switch.

Some of the critical issues involved in DAC switching are as follows. In standard CMOS logic circuits, the propagation speed of a low to high transition is different to that of a high to low transition and can be altered by the ratio of PMOS to NMOS device strengths. Unequal delay for low to high and high to low transitions from the edge of the clock signal which causes new data to be passed into the output switch of a digital-analog converter causes even order distortion components in the reconstructed output waveform.

In addition, static data storage (latch) generally requires full power rail signal swings where dynamic storage (on a capacitor) can operate with almost any signal levels. It is desirable to limit the magnitude of the signal at the control gates of a differential current switch to be no more than the Vgs of an on switch transistor.

SUMMARY OF THE INVENTION

The invention provides a differential current switch including means for receiving a control signal and for producing a complement of the control signal. A plurality of storage elements stores the signals and provides a pair of complementary output signals having the same binary values as the control signal and its complement stored within the storage elements. There are provided means for isolating the control input from the storage elements, and once per clock period, simultaneously transferring the control input and its complement to the storage elements. A differential switch pair has first and second complementary control inputs which receive first and second complementary signals so that the differential switch pair is controlled by the control signal with equal delay from the clock signal. First switching means are coupled to provide the first complementary signal which controls the first complementary control input of the differential switch pair in response to receiving a first input signal. Second switching means are coupled to provide the second complementary signal which controls the second complementary control input of the differential switch pair in response to receiving a second input signal. First delay means are coupled to the complementary outputs of the storage elements having the property that the fall times of its outputs are greater than the rise time of its outputs. Second delay means are provided having the property that the rise times of its outputs are greater than the fall times of its outputs. The second delay means are coupled between the outputs of the first delay means and the first and second switching means such that one output of the second delay means provides the first input signal to the first switching means and the second input signal of the second switching means, and another output of the second delay means provides the second input signal to the first switching means and the first input signal of the second switching means.

DETAILED DESCRIPTION OF THE ILLUSTRATED EMBODIMENTS

Figure 1:
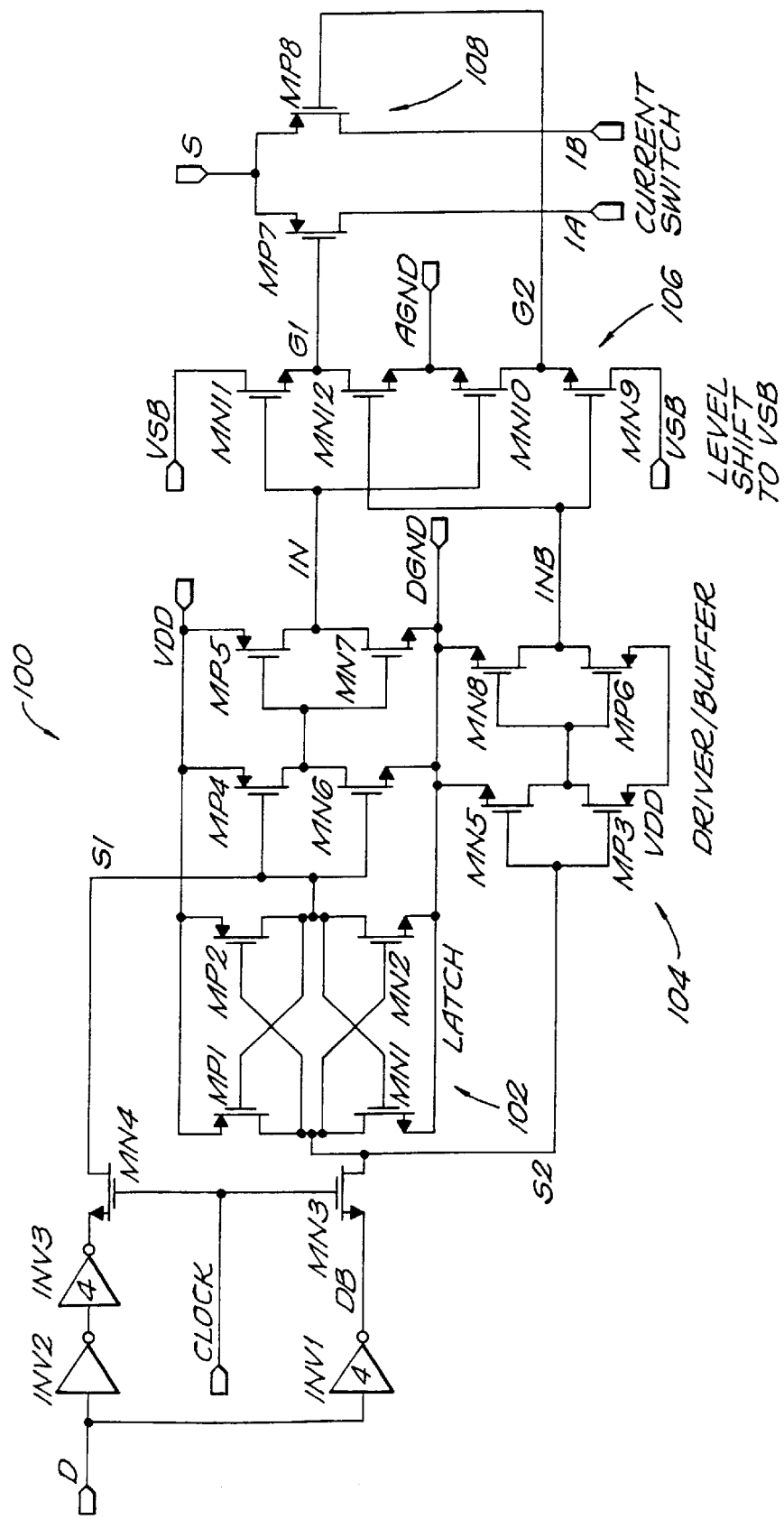
FIG. 1 is a schematic diagram of a differential switch circuit in accordance with the invention.

FIG. 1 is a schematic diagram of a differential switch circuit in accordance with the invention. The circuit is symmetric and what is true for one side or signal path holds true for the other. The circuit 100 includes a latch 102, a driver/buffer 104, a level shifter 106 and a current switch 108.

The latch 102 receives signals from the DATA node and splits between two paths, one having inverter INV1 and the other including INV2 and INV3, which in turn are fed to pass NMOS transistors MN3 and MN4, respectively. Accordingly, the input signal is split into a true and complementary signal, the complementary signal being present at node D1B. Devices MN3 and MN4 should be sized such that their strength in combination with that of inverters INV1 and INV3 is enough to overpower the transistors used in the latch 102.

The signal on node D is allowed to change only during the time that the clock signal on node CLK is low. This blocks the transfer of the new data through the transistors MN3 and MN4, which serve as pass gates, into a static latch. PMOS transistors MP1,MP2 and NMOS transistors MN1,MN2 form a "cross coupled inverter" latch which holds the data state while CLK is low. Nodes S1 and S2 are buffered by a series connection of two CMOS inverters within the driver/buffer 104, NMOS transistors MN6,MN7 and PMOS transistors MP4,MP5 for node S1, and NMOS transistors MN5, MN8 and PMOS transistors MP6,MP8 for node S2.

The sizes and strengths of the devices which make up the CMOS inverters are configured in such a way to insure that the propagation of a high to low transition on node S1 through to node IN is faster than a low to high transition. The same holds true for the node S2 to INB path. In the illustrated exemplary embodiment, the PMOS transistors MP3 and MP4 are wider than the NMOS transistors MN5 and MN6 by a ratio of 4 to 1 in the first inverter stage of the buffer. In the second inverter stage of the buffer, the PMOS transistors MP5 and MP6 are wider than the NMOS transistors MN5 and MN6 by a ratio of 1.75 to 1.

In the state where node IN is high (INB low), NMOS MN11 of the level shifter 106 is on (MN12 off) in order to connect node G1 to bias voltage VSB. Also, MN10 is on (MN9 off) in order to connect node G2 to a ground terminal AGND. The width and thus the driving strength of devices MN9, MN10, MN11 and MN12 is determined by the size and thus the loading of the PMOS devices comprising the current switch, MP7 and MP8. Accordingly, PMOS transistor MP7 is turned on allowing a switching current S to be connected to node IA.

In the state where node IN is low (INB high), NMOS MN9 is on (MN10 off) connecting node G2 to VSB. Also, MN12 is on (MN11 off) connecting node G1 to AGND. Accordingly, PMOS transistor MP8 is turned on allowing the switching current S to be connected to node IB.

When the node S1 transitions from high to low, this high to low transition arrives at node IN before the complementary low to high transition arrives at node INB. This occurrence causes MN11 (and MN10) to turn off before MN12 turns on. During this time (when IN and INB are both low), nodes G1 and G2 are floating, and by virtue of their inherent capacitance remain at nearly the same voltage they were before.

Figure 2A:
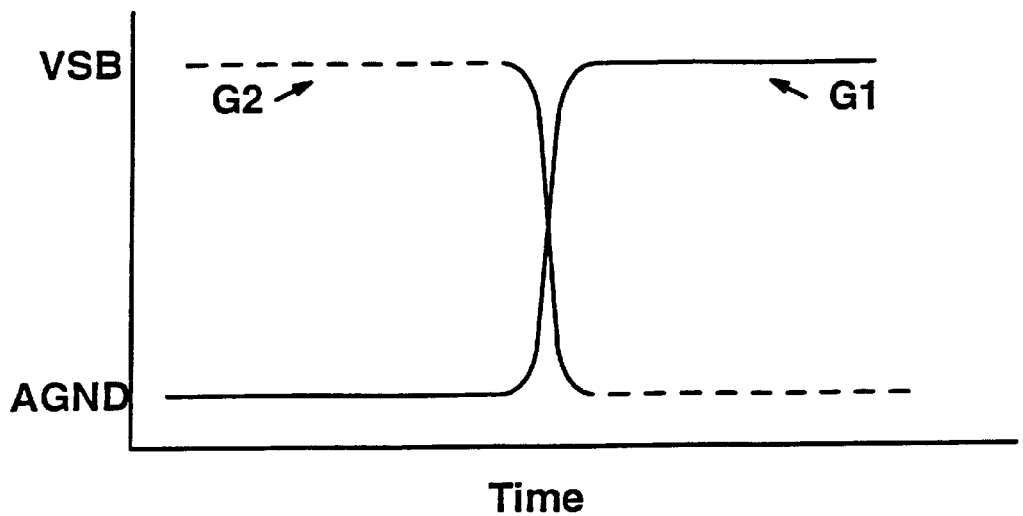
FIGS. 2A and 2B are timing diagrams of nodes IN and INB of FIG. 1, with INB going from high to low ahead of IN going from low to high.
Figure 2B:
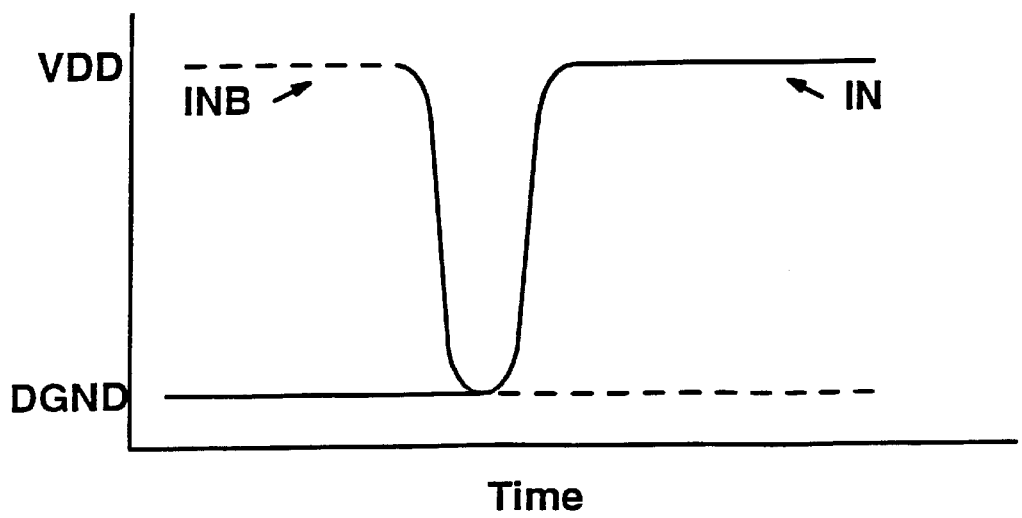

Now when the low to high transition on node INB arrives, the two NMOS devices MN12 and MN9 turn on. This causes node G1 to go to ground at exactly the same time as node G2 goes to VSB. Reference is now made to the timing diagrams of FIGS. 2A and 2B of nodes IN and INB, with INB going from high to low ahead of IN going from low to high. Also, note the plot of nodes G1 and G2 which cross when IN goes high and not when INB goes low. In FIG. 2A, the solid line is a plot of the voltage on node G1 and the dashed line is a plot of the voltage on node G2. In FIG. 2B, the solid line is a plot of the voltage on node IN and the dashed line is a plot of the voltage on node INB.

With the circuit operation described, the propagation delay from the input CLK to the point in time when the current in the output is switching is the same for both a 0 to 1 and a 1 to 0 change on the input DATA. This delay is set by the slower 0 to 1 delay through the inverters and not the faster 1 to 0 delay.

Only NMOS devices are used in the level shifter 106. This is required because both the pull up device on one side and the pull down device on the other side need to operate at the same time from the same signal node. Complementary PMOS devices with their gates tied to same nodes (IN and INB) as the NMOS devices would turn on before the NMOS because the high to low transition (turning off the NMOS) happens before the low to high transition as shown in FIG. 2B.

With respect to the circuit 100 of FIG. 1, if the voltage (supply) on node VDD is not larger than the voltage on node VSB by enough to turn on transistors MN11 and MN9 hard, then nodes G1 and G2 may not make it all the way to VSB. For example, if VDD is lowered to 2.7 volts with VSB at 2.0 volts, the Vgs of MN11/MN9 will be 2.7–2.0 or only 0.7 volts. In the case of a 0.6 micron CMOS process technology, the threshold voltage of the NMOS devices could be 1.0 volt or more, including back-gate bias effects.

Figure 4:
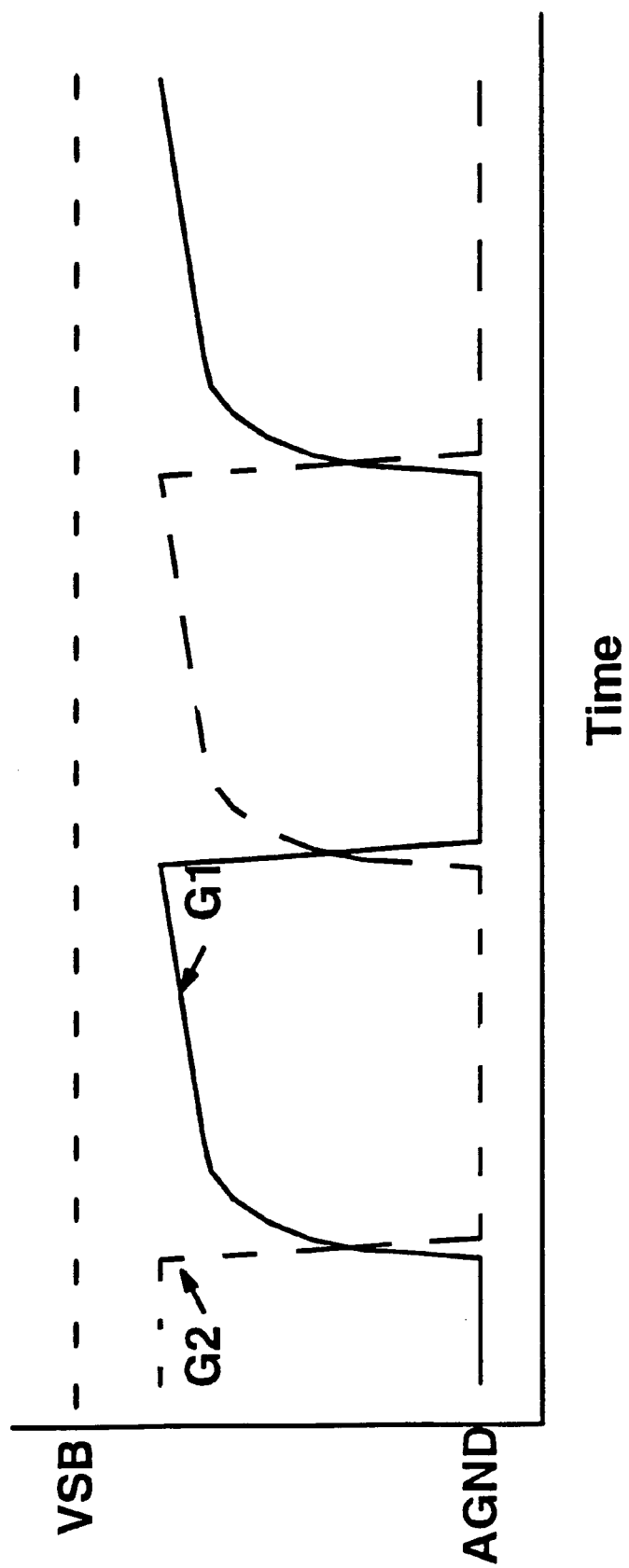
FIG. 4 is a timing diagram of nodes G1 and G2 of FIG. 1 with VDD at 2.7 V.

When node IN is low the Vgs of MN11 is the full 2.7 volts of VDD. As node IN rises toward VSB, the Vgs of MN11 gets smaller and smaller. At steady state, these devices will not be on and nodes G1 and G2 will be very weakly driven. This effect is shown in the diagram of FIG. 4. The voltage on node VSB is as in the previous example 2.0 volts with VDD (the power supply) equal to 2.7 volts. Nodes G1 and G2 rise to only about 1.6 volts and have not fully reached the level of VSB before the next clock event.

One of the fundamental concepts of the invention is that it is desirable to have one edge of the signal performing all of the necessary switching in the output. The other signal edges are placed in such a way as to exploit the property of the dynamic storage of the previous state for a short period of time before transitioning to the new state, as shown in FIG. 2A.

Figure 3:
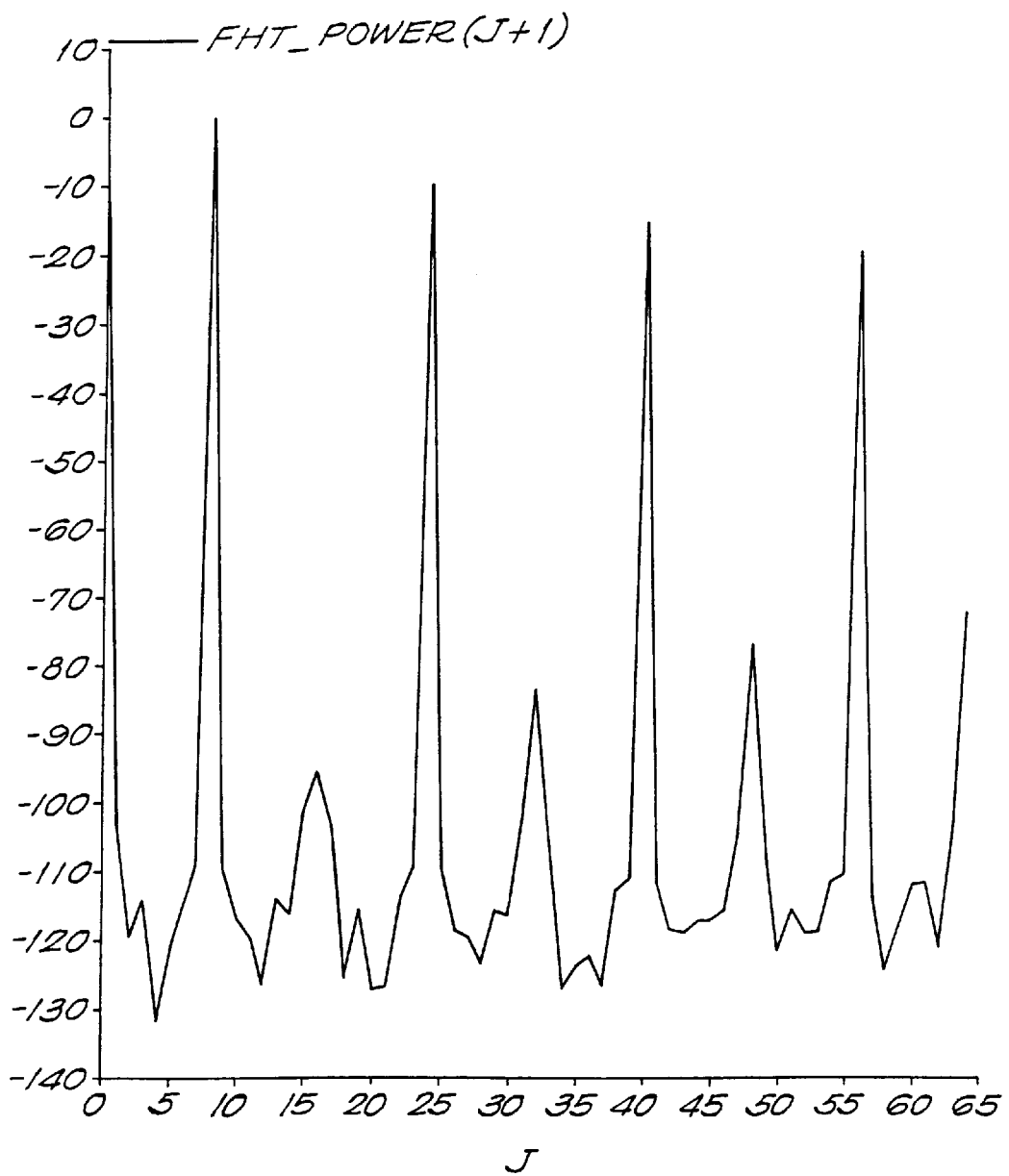
FIG. 3 is a plot of a FFT of a 32 MHz square wave with second harmonic at –96 dB.

FIG. 3 provides an indication of how well the circuit is doing in light of the desire to make a square wave with the output. If the data were alternated every other clock cycle, a 50% duty cycle square wave will be made on the output. Mathematically a square wave should only have odd order frequency components, three times its fundamental frequency by odd numbers. If a restructured square wave has any components which are even multiples of the fundamental, the length of time the waveform is high is not exactly equal to the length of time the waveform was low or the rise and fall times are not equal. Asymmetry such as this in the waveform should be avoided. When various square waveforms are combined in such a way to create a single sine waveform, the odd order components in the square waveforms cancel each other while the even order terms do not. This results in even order distortion in the reconstructed output. FIG. 3 is a plot of a FFT of a 32 MHz square wave with second harmonic at −96 dB, and provides an indication of how well the circuit makes the required square waves.

Figure 5:
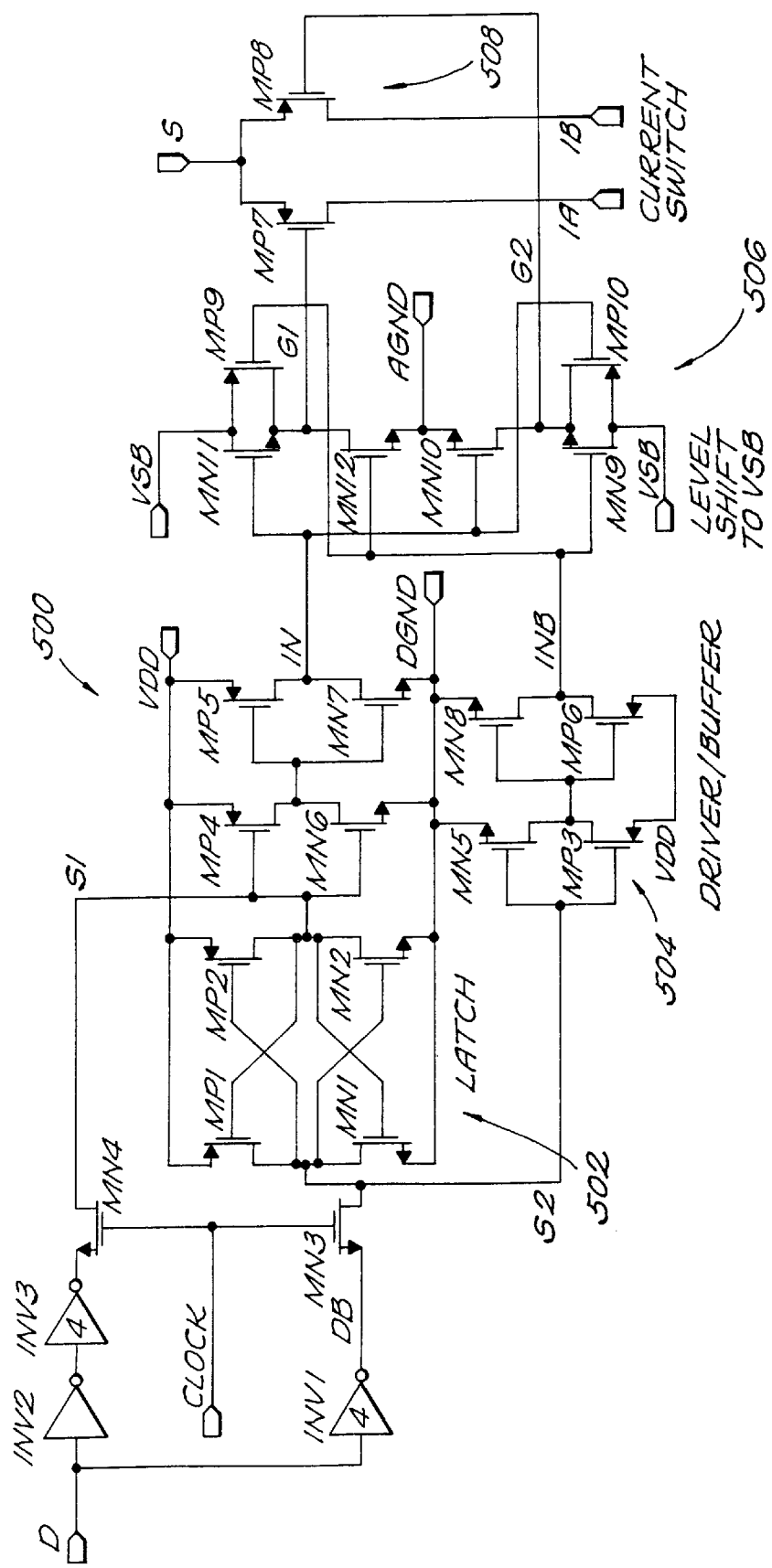
FIG. 5 is a schematic diagram of an alternative embodiment of a differential switching circuit in accordance with the invention.

FIG. 5 is a schematic diagram of an alternative embodiment of a differential switching circuit 500 in accordance with the invention. Unless as otherwise stated, the circuit 500 includes many of the same elements present in circuit 100 of FIG. 1 including latch 502, driver/buffer 504, level shifter 506 and current switch 508. PMOS transistors MP9 and MP10 are added in parallel with the NMOS transistors of the level shifter 506 to help drive nodes G1 and G2. To turn on these PMOS devices, their gates would be driven to ground (node DGND) while the corresponding NMOS device's gate is driven to VDD. As previously described, the exact timing when these. Various devices turn on and off is very important. It is preferable to arrange the timing of when the PMOS turn on to be after the NMOS has done most of the work pulling nodes G1 and G2 to the VSB potential. In FIG. 5, the PMOS device in parallel with MN11 (whose gate is tied to node IN) could have its gate tied to node INB for example. However, they would then turn on at the wrong time.

Figure 6:
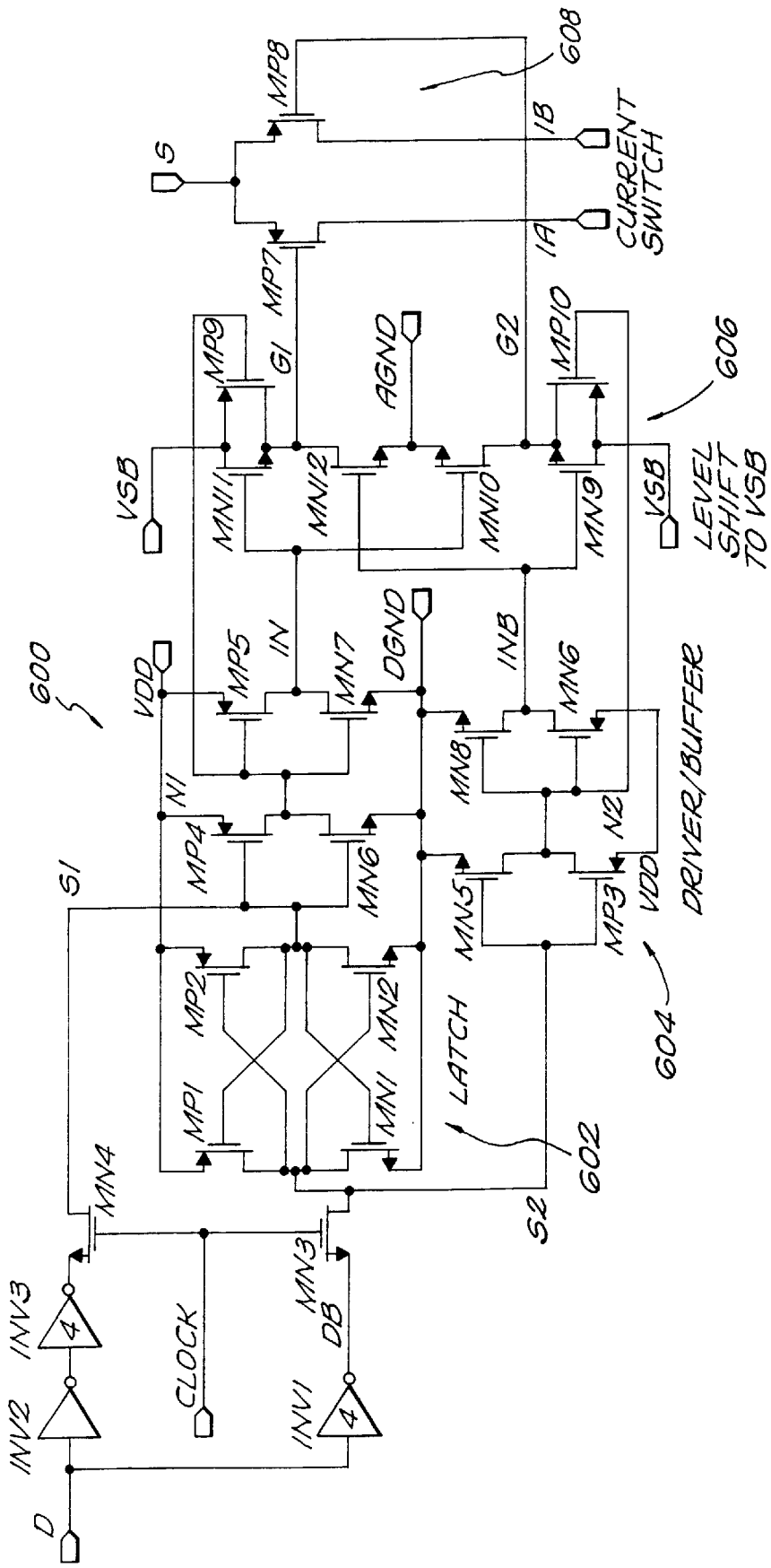
FIG. 6 is a schematic diagram of another alternative embodiment of a differential switching circuit in accordance with the invention.

It is desirable to devise a scheme where the PMOS devices do no harm when the voltage on VDD is large and take over when the voltage on VDD is small. Accordingly, FIG. 6 is a schematic diagram of an alternative embodiment of a differential switching circuit 600 in accordance with the invention. Unless as otherwise stated, the circuit 600 includes many of the same elements present in circuit 100 of FIG. 1 including latch 602, driver/buffer 604, level shifter 606.

The circuit 600 is configured for connecting the gates of the PMOS devices (transistors MP9 and MP10) where they turn on after the NMOS devices. The gate of transistor MP9 (across MN11 with its gate driven from IN) is connected to node N1, the gates of MP5 and MN7 which is the input of the inverter stage which drives node IN. The rise and fall times on nodes N1 and IN are made to be different. Node N1 falls slowly and rises quickly because MN6 is weak relative to MP4 by the ratio of 4 to 1. Node IN has a much faster fall time and its rise time is only a little slower because MN7 and MP5 are closer in strength to each other. Transistor MP9 will turn on when its gate reaches a PMOS threshold voltage below node VSB.

The switching threshold of the MP5,MN7 inverter is roughly ½ the supply voltage on VDD (2.5 volts when VDD is equal to 5 volts). With this being the case, node IN will already be going up before node N1 has fallen to a PMOS threshold below node VSB. Node N1 has a fast rise time and the PMOS devices will turn off before node IN starts to fall.

Figure 7:
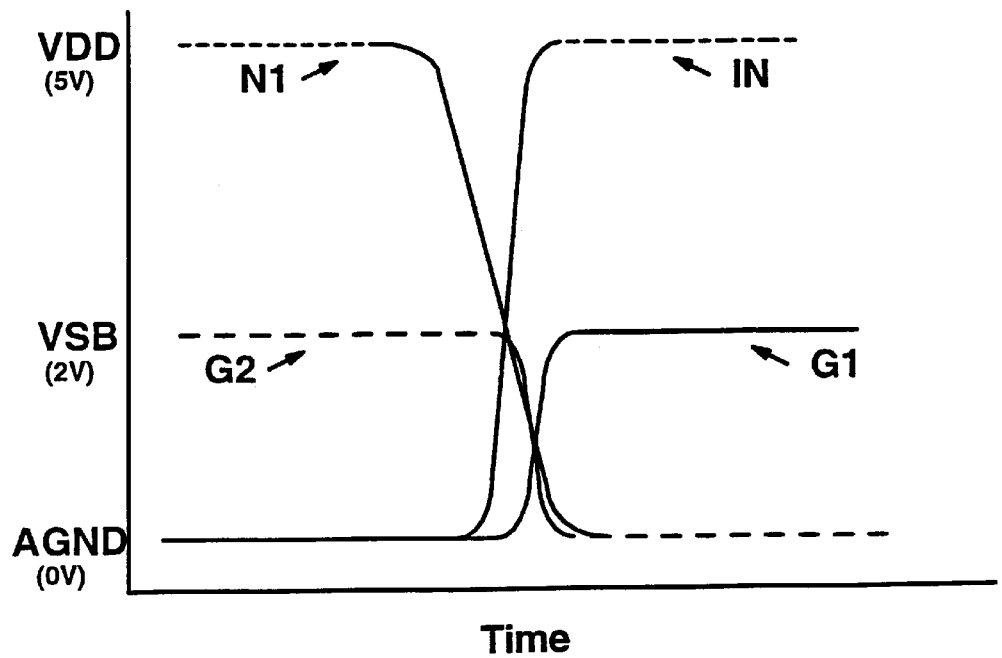
FIGS. 7–10 are diagrams of the relative timing and rise and fall times of the nodes N1, IN, G1 and G2 of FIG. 6.

The relative timing and rise and fall time of these nodes are shown in the timing diagrams plotted in FIGS. 7–10. With VDD set to 5 volts, FIG. 7 shows the fall time of node N1 and the rise time of node IN along with the waveforms on nodes G1 and G2. When node N1 has fallen to a PMOS threshold below VSB, transistor MP11 will start to turn on, and when node IN has reached an NMOS threshold above VSB transistor MN11 will start to turn on. Due to the slow fall of node N1 and the fast rise of node IN, the transistor MN11 turns on before MP9.

Figure 8:
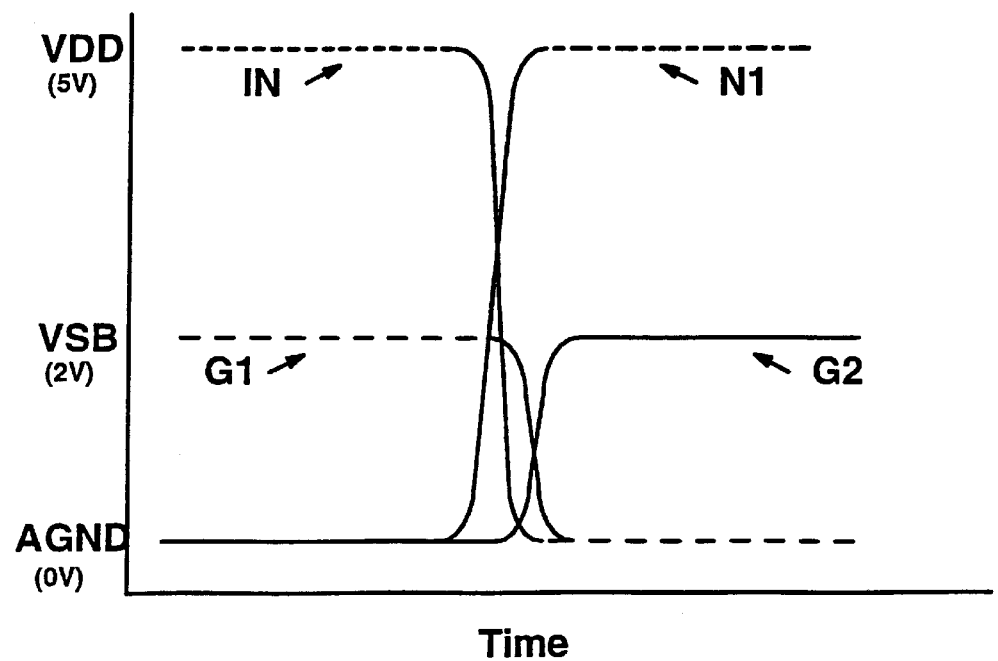

With VDD set to 5 volts, FIG. 8 shows the turn off characteristics of MP9 and MN11. Due to the fast rise time of node N1 and thus the fast fall time of node IN, both transistors turn off before node INB has turned on MN12 to pull node G1 low.

Figure 9:
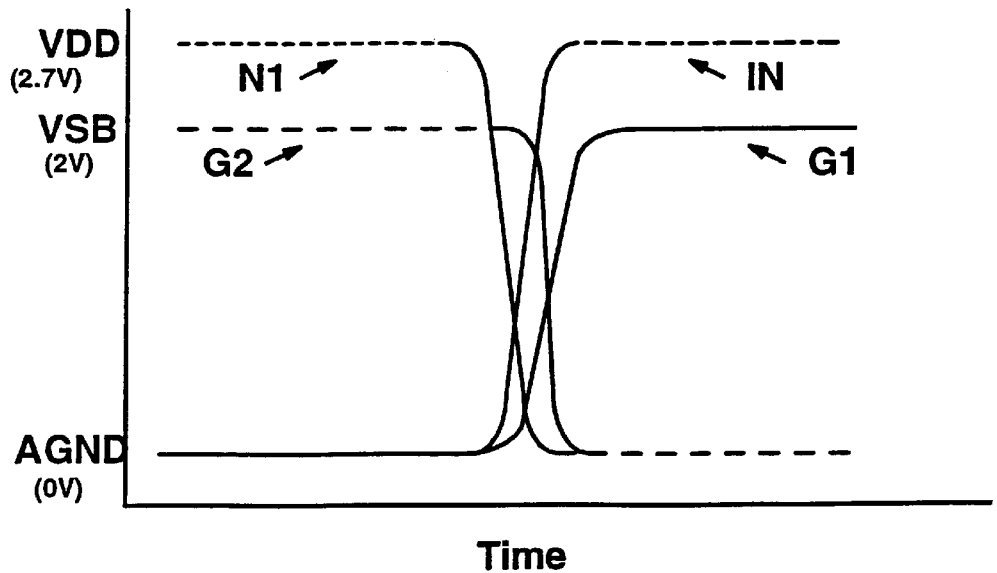
Figure 10:
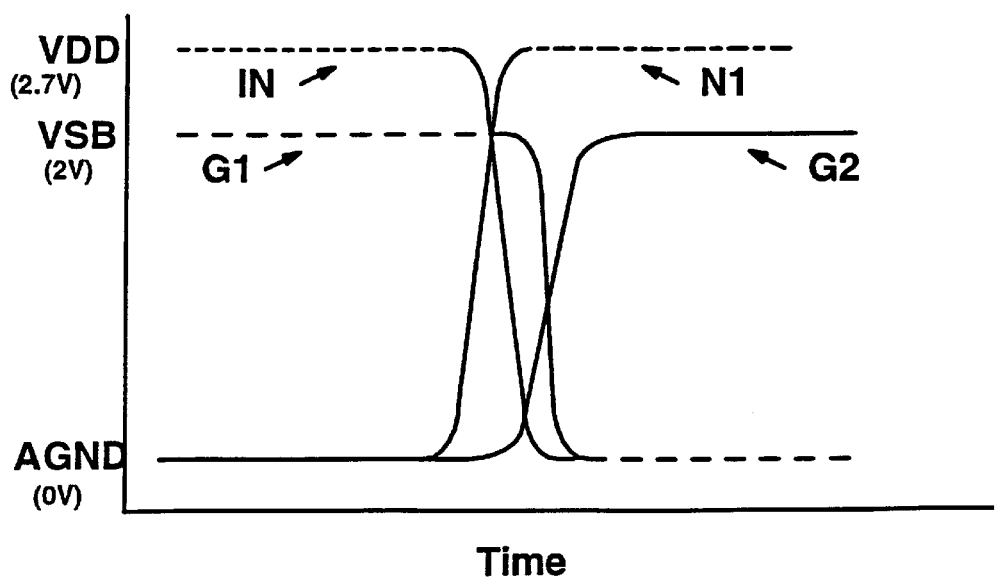

With VDD set to 2.7 volts, FIG. 9 shows the same turn on characteristics of MP9 and MN11 shown in FIG. 7. However, node G1 is pulled all the way to VSB. With VDD set to 2.7 volts, FIG. 10 shows the same turn off characteristics of MP9 and MN11 as shown in FIG. 8.

The foregoing description has been set forth to illustrate the invention and is not intended to be limiting. Since modifications of the described embodiments incorporating the spirit and substance of the invention may occur to persons skilled in the art, the scope of the invention should be limited solely with reference to the appended claims and equivalents thereof.

What is claimed is:

1. A differential current switch, comprising:

means for receiving a control signal and a periodic clock signal;

means for producing a complement of said control signal;

a plurality of storage elements for storing said signals and to provide a pair of complementary output signals having the same binary values as the control signal and its complement stored within said storage elements;

means for isolating said control input from said storage elements, and once per clock period, simultaneously transferring the control signal and its complement to said storage elements;

a differential switch having first and second complementary control inputs which receive first and second complementary signals so that said differential switch is controlled by said control signal with equal delay from said clock signal;

first switching means coupled to provide said first complementary signal which controls the first complementary control input of said differential switch;

second switching means coupled to provide said second complementary signal which controls the second complementary control input of said differential switch;

first delay means coupled to the complementary outputs of said storage elements having the property that the fall times of its outputs are greater than the rise time of its outputs; and second delay means having the property that the rise times of its outputs are greater than the fall times of its outputs, said second delay means being coupled between the outputs of said first delay means and said first and second switching means such that one output of said second delay means provides a first input signal to the first switching means and a second input signal of the second switching means, and another output of said second delay means provides the second input signal to the first switching means and the first input signal of the second switching means.

2. The current switch of claim 1, wherein said receiving means comprises an inverter which generates said complement of said control signal.

3. The current switch of claim 1, wherein said storage elements comprise a pair of cross-coupled weak inverters.

4. The current switch of claim 1, wherein said storage elements comprise capacitors.

5. The current switch of claim 1, wherein said isolating means comprises a pair of transfer switches which are responsive to said clock signal and coupled between said receiving means and said storage elements.

6. The current switch of claim 1, wherein said differential switch comprises a pair of PMOS FETs connected in a differential configuration.

7. The current switch of claim 6, wherein said first and second switching means each comprise a pair of NMOS FET transistors.

8. The current switch of claim 7, wherein said first and second switching means are respectively operable for connecting an output to a first reference voltage in response to receiving a first input signal or a second reference voltage in response to receiving a second input signal.

9. The current switch of claim 8, wherein said first reference voltage is substantially greater than the switching threshold of said differential switch.

10. The current switch of claim 9, wherein said second reference voltage is substantially less than the switching threshold said differential switch.

11. The current switch of claim 10, wherein said first reference voltage is equal to the gate to source potential of said FETs in said differential switch pair while conducting current.

12. The current switch of claim 11, wherein said second reference voltage is equal to ground potential.

13. The current switch of claim 1, wherein said first and second delay means comprise CMOS inverters.

14. A differential current switch, comprising:

an input at which a control signal is received;

an inverter which produces a complement of said control signal;

a cross coupled inverter which stores said control and complement signals and provides a pair of complementary output signals having the same binary values as the control signal and its complement stored within said cross coupled inverter;

a pair of gate transistors which isolate said control input from said cross coupled inverter and simultaneously transfers the control input and its complement to said cross coupled inverter in response to receiving a periodic clock signal;

a differential switch pair of transistors having first and second complementary control inputs which receive first and second complementary signals so as to be controlled by said control signal with equal delay from said clock signal;

a first set of switching transistors coupled to provide said first complementary signal which controls the first complementary control input of said differential switch pair;

a second set of switching transistors coupled to provide said second complementary signal which controls the second complementary control input of said differential switch pair;

first delay transistor pairs coupled to the complementary outputs of said cross coupled inverter and having the characteristic that the fall times of its outputs are greater than the rise time of its outputs; and second delay transistor pairs coupled to said first delay transistor pairs and having the characteristic that the rise times of its outputs are greater than the fall times of its outputs, said second delay transistor pairs being coupled to said first and second sets of switching transistors such that a first output of said second delay transistor pairs provides a first input signal to the first set of switching transistor pairs and a second input signal of the second set of switching transistor pairs, and a second output of said second delay transistor pairs provides the second input signal to the first set of switching transistor pairs and the first input signal of the second set of switching transistor pairs.

15. The current switch of claim 14, wherein said differential switch pair comprises a pair of PMOS transistors connected in a differential configuration.

16. The current switch of claim 14, wherein said first and second sets of switching transistors each comprise a pair of NMOS transistors.

17. The current switch of claim 16, wherein said first and second sets of switching transistors are respectively operable for connecting an output to a first reference voltage in response to receiving a first input signal or a second reference voltage in response to receiving a second input signal.

18. The current switch of claim 17, wherein said first reference voltage is substantially greater than the switching threshold of said differential switch pair.

19. The current switch of claim 18, wherein said second reference voltage is substantially less than the switching threshold said differential switch.

20. The current switch of claim 19, wherein said first reference voltage is equal to the gate to source potential of said differential switch pair of transistors while conducting current.

21. The current switch of claim 20, wherein said second reference voltage is equal to ground potential.

22. The current switch of claim 14, wherein said first and second delay transistor pairs comprise CMOS inverters.

* * * * *